(12) United States Patent
Lee et al.

(10) Patent No.: US 12,638,519 B2
(45) Date of Patent: May 26, 2026

(54) ATOMIC MAGNETOMETER WITH EXTENDED MEASUREMENT BANDWIDTH

(71) Applicant: Electronics and Telecommunications Research Institute, Daejeon (KR)

(72) Inventors: Hyunjoon Lee, Daejeon (KR); Jang Yeol Kim, Daejeon (KR); Jung Hoon Oh, Daejeon (KR); In Kui Cho, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 219 days.

(21) Appl. No.: 18/405,506

(22) Filed: Jan. 5, 2024

(65) Prior Publication Data

US 2024/0272243 A1     Aug. 15, 2024

(30) Foreign Application Priority Data

Feb. 15, 2023     (KR) ......................... 10-2023-0020288

(51) Int. Cl.
*G01R 33/032* (2006.01)
(52) U.S. Cl.
CPC .................................. *G01R 33/032* (2013.01)
(58) Field of Classification Search
CPC .................................................... G01R 33/032
See application file for complete search history.

(56) References Cited

U.S. PATENT DOCUMENTS

| | | | |
|---|---|---|---|
| 9,778,328 B2 | 10/2017 | Bulatowicz et al. | |
| 11,199,595 B2 | 12/2021 | Lee et al. | |
| 2006/0123895 A1 | 6/2006 | Lee et al. | |
| 2016/0231395 A1* | 8/2016 | Foley | G01R 33/26 |
| 2021/0109173 A1* | 4/2021 | Lee | G01R 33/26 |
| 2024/0167945 A1* | 5/2024 | Hu | G01N 21/636 |

FOREIGN PATENT DOCUMENTS

| | | |
|---|---|---|
| KR | 10-1624482 B1 | 5/2016 |
| KR | 10-2021-0044687 A | 4/2021 |
| KR | 10-2022-0134836 A | 10/2022 |

OTHER PUBLICATIONS

Pei-Xian Miao, et al., "Wide-range and self-locking atomic magnetometer based on free spin precession", Journal of the Optical Society of America B, Apr. 2019, pp. 819-828, vol. 36, No. 4.

* cited by examiner

*Primary Examiner* — Alesa Allgood
(74) *Attorney, Agent, or Firm* — Sughrue Mion, PLLC

(57) ABSTRACT

An atomic magnetometer with an extended measurement bandwidth is disclosed. The atomic magnetometer includes coils configured to transmit incident pump light and a bias magnetic field and a vapor cell positioned between the coils and receiving the pump light and the bias magnetic field transmitted from the coils and irradiation light incident from a direction perpendicular to the coils, wherein the vapor cell includes both a first alkali metal atom and a second alkali metal atom, which are isotopes of one of alkali metals.

12 Claims, 8 Drawing Sheets

$$S_{85}(f_1) + S_{87}(f_1) + S_{85}(f_2) + S_{87}(f_2) + S_{85}(f_3) + S_{87}(f_3)$$

$$S_{85}(f_1) + S_{87}(f_1) + S_{85}(f_2) + S_{87}(f_2) + S_{85}(f_3) + S_{87}(f_3)$$
$$+ S_{85}(f_4) + S_{85}(f_5) + S_{85}(f_6) + S_{85}(f_7) + S_{87}(f_8)$$

ATOMIC MAGNETOMETER WITH EXTENDED MEASUREMENT BANDWIDTH

CROSS-REFERENCE TO RELATED APPLICATION

This application claims the benefit of Korean Patent Application No. 10-2023-0020288 filed on Feb. 15, 2023, in the Korean Intellectual Property Office, the entire disclosure of which is incorporated herein by reference for all purposes.

BACKGROUND

1. Field of the Invention

One or more embodiments relate to an atomic magnetometer that extends a measurement bandwidth by arranging different vapor cells.

2. Description of the Related Art

An atomic magnetometer is a device for measuring a magnetic field by utilizing the interaction between atoms and resonant light under the magnetic field. The sensitivity of the atomic magnetometer is an indicator of the smallest detectable magnetic field and represented by the arrangement maintenance time of atomic spins and a signal-to-noise ratio. Therefore, when a response to an external magnetic field is represented by a function of a frequency, an atomic magnetometer with superior sensitivity inevitably has a narrow measurement bandwidth since the linewidth and sensitivity of a signal are interrelated.

The conventional negative feedback method for extending the measurement bandwidth of an atomic magnetometer is a technique that enhances a linear response of a magnetometer. An atomic magnetometer exhibits a non-linear response to an external magnetic field. Through negative feedback, an output with a highly responsive frequency component is input in a negative direction, resulting in a flat response. With this technique, a measurement bandwidth is extended in a way that sacrifices the sensitivity of a magnetometer to increase linearity. The negative feedback method increases a measurement bandwidth but decreases magnetic sensitivity.

Thus, there is a demand for an atomic magnetometer that may extend a measurement bandwidth while minimizing a decrease in magnetic sensitivity.

SUMMARY

Embodiments provide an atomic magnetometer that minimizes a decrease in magnetic sensitivity and extends a measurement bandwidth by arranging a first vapor cell including all isotopes of one of alkali metals and a second vapor cell including one of the isotopes.

Embodiments also provide an atomic magnetometer that may effectively modify or extend the operating frequency of the atomic magnetometer by arranging a first vapor cell including all isotopes of one of alkali metals and a second vapor cell including one of the isotopes, thereby saving costs, energy, and space.

According to an aspect, there is provided an atomic magnetometer including coils configured to transmit incident pump light and a bias magnetic field and a vapor cell positioned between the coils and receiving the pump light and the bias magnetic field transmitted from the coils and irradiation light incident from a direction perpendicular to positions of the coils, wherein the vapor cell includes both a first alkali metal atom and a second alkali metal atom, which are isotopes of one of alkali metals.

The vapor cell may include both $^{85}$Rb and $^{87}$Rb, which are isotopes of rubidium.

The pump light may be tuned to function as first pump light acting on $^{85}$Rb and second pump light acting on $^{87}$Rb.

A wavelength of the pump light simultaneously may act on an $F_g=3 \rightarrow F_e=2,3$ transition of the first alkali metal atom and an $F_g=2 \rightarrow F_e=1,2$ transition of the second alkali metal atom.

The irradiation light may be tuned such that irradiation light, which is red-detuned based on an $F=1 \rightarrow F'=1$ transition of the second alkali metal atom, corresponds to irradiation light, which is blue-detuned based on an $F=2 \rightarrow F'=3$ transition of the first alkali metal atom.

The pump light and the irradiation light may not share a same ground level at energy levels of the first alkali metal atom and the second alkali metal atom.

According to another aspect, there is provided an atomic magnetometer including coils configured to transmit incident pump light and a bias magnetic field and vapor cells positioned between the coils and receiving the pump light and the bias magnetic field transmitted from the coils and irradiation light incident from a direction perpendicular to positions of the coils, wherein the vapor cells include one of a first alkali metal atom and a second alkali metal atom, which are isotopes of one of alkali metals, and wherein the bias magnetic field is a gradient magnetic field configured to cause a difference in a magnetic field applied to each of the vapor cells.

A wavelength of the pump light simultaneously may act on an $F_g=3 \rightarrow F_e=2,3$ transition of the first alkali metal atom and an $F_g=2 \rightarrow F_e=1,2$ transition of the second alkali metal atom.

The irradiation light may be tuned such that irradiation light, which is red-detuned based on an $F=1 \rightarrow F'=1$ transition of the second alkali metal atom, corresponds to irradiation light, which is blue-detuned based on an $F=2 \rightarrow F'=3$ transition of the first alkali metal atom.

According to another aspect, there is provided an atomic magnetometer including coils configured to transmit incident pump light and a bias magnetic field and a first vapor cell including both a first alkali metal atom and a second alkali metal atom, which are isotopes of one of alkali metals, and receiving the pump light and the bias magnetic field transmitted from the coils and irradiation light incident from a direction perpendicular to positions of the coils, and a second vapor cell including one of the first alkali metal atom or the second alkali metal atom, wherein the irradiation light, the pump light, and the bias magnetic field are incident on the second vapor cell.

The second vapor cell may be disposed in series with the first vapor cell, wherein the irradiation light, pump light passing through the first vapor cell, and a bias magnetic field may be incident on the second vapor cell.

The second vapor cell may be disposed in parallel with the first vapor cell, wherein pump light and a bias magnetic field, which are identical to pump light and a bias magnetic field incident on the first vapor cell, and the irradiation light are incident on the second vapor cell.

The bias magnetic field may be a gradient magnetic field configured to cause a difference in a magnetic field applied to each of the vapor cells.

Additional aspects of embodiments will be set forth in part in the description which follows and, in part, will be apparent from the description, or may be learned by practice of the disclosure.

According to an embodiment, an atomic magnetometer may minimize a decrease in magnetic sensitivity and may extend a measurement bandwidth by arranging a first vapor cell including all isotopes of one of alkali metals and a second vapor cell including one of the isotopes.

In addition, according to an embodiment, an atomic magnetometer may effectively modify or extend the operating frequency of the atomic magnetometer by arranging a first vapor cell including all isotopes of one of alkali metals and a second vapor cell including one of the isotopes, thereby saving costs, energy, and space.

BRIEF DESCRIPTION OF THE DRAWINGS

These and/or other aspects, features, and advantages of the invention will become apparent and more readily appreciated from the following description of embodiments, taken in conjunction with the accompanying drawings of which.

DETAILED DESCRIPTION

Hereinafter, embodiments of the present disclosure are described in detail with reference to the accompanying drawings.

Figure 1:
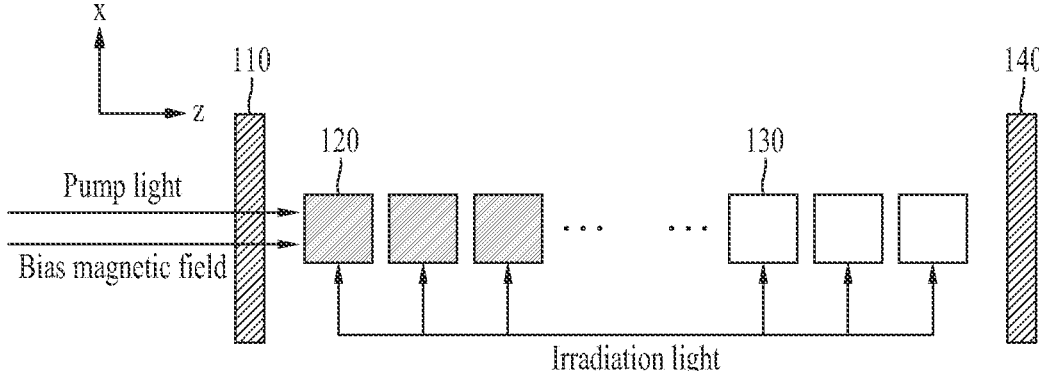
FIG. 1 is a diagram illustrating an atomic magnetometer according to an embodiment.

FIG. 1 is a diagram illustrating an atomic magnetometer according to an embodiment.

As illustrated in FIG. 1, the atomic magnetometer may include coils 110 and 140, a first vapor cell 120, and a second vapor cell 130.

The coils 110 and 140 may transmit pump light output from a single light source and a bias magnetic field generated by a single bias magnetic field-generating device. The coils 110 and 140 may be connected to each other in series as a pair of coils. In addition, a uniform magnetic field or a gradient magnetic field may be formed depending on the sizes (diameters) of the coils 110 and 140 and the distance between the coils 110 and 140.

The first vapor cell 120 may include both a first alkali metal atom and a second alkali metal atom, which are the isotopes of one of alkali metals. The first vapor cell 120 may receive the pump light and the bias magnetic field transmitted from the coils 110 and 140 and irradiation light incident from a direction perpendicular to the positions of the coils

Figure 4:
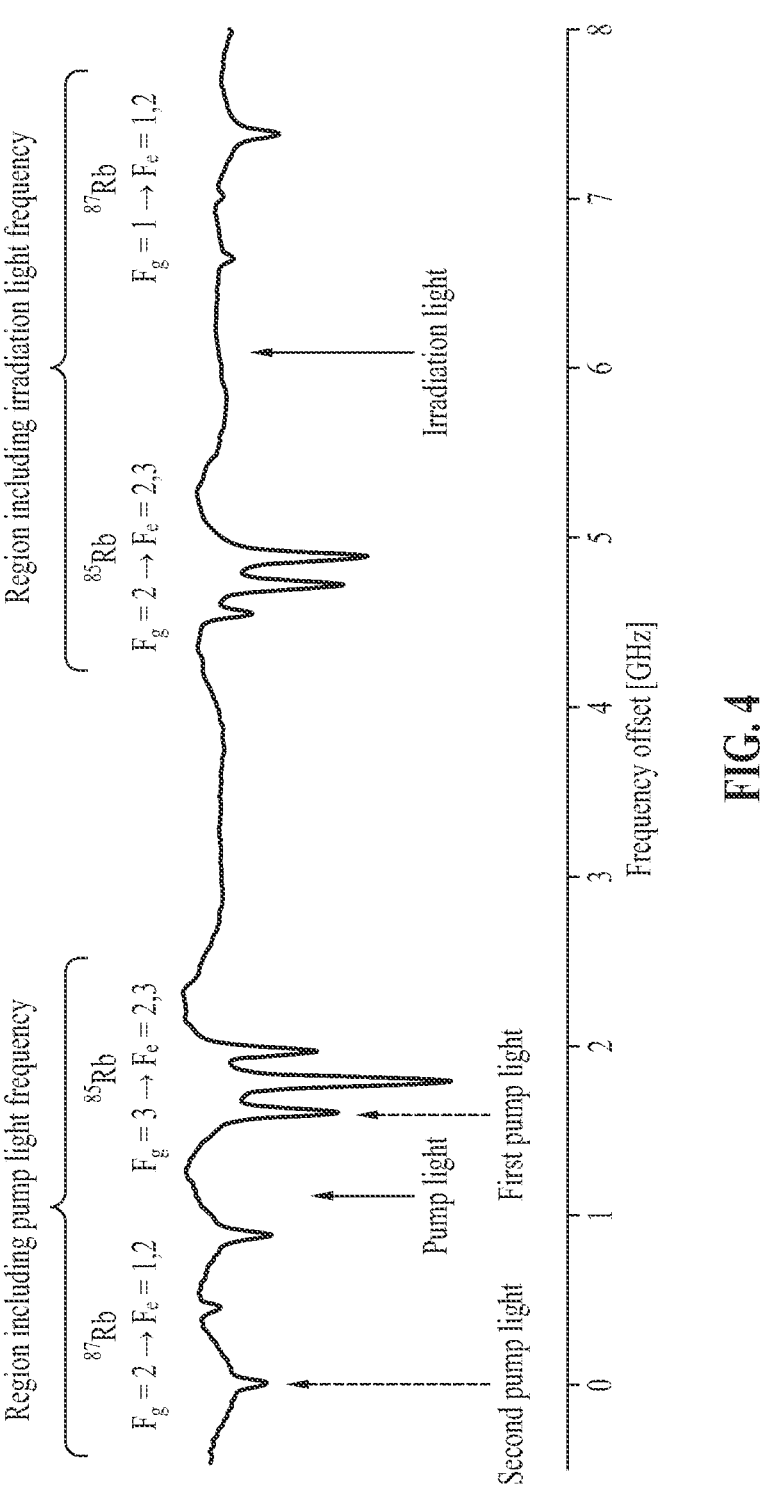
FIG. 4 is an example of tuning pump light and irradiation light of an atomic magnetometer according to an embodiment.

110 and 140. The wavelengths of light sources outputting the pump light and the irradiation light may be as illustrated in FIG. 4, respectively.

The second vapor cell 130 may include one of the first alkali metal atom or the second alkali metal atom, and the irradiation light, the pump light, and the bias magnetic field may be incident on the second vapor cell 130.

Depending on the incident position of the pump light, the first vapor cell 120 and the second vapor cell 130 may be arranged in one dimension or two dimensions. For example, the second vapor cell 130 may be disposed in series with the first vapor cell 120, and the irradiation light, the pump light passing through the first vapor cell 120, and the bias magnetic field may be incident on the second vapor cell 130. In addition, the second vapor cell 130 may be disposed in parallel with the first vapor cell 120. Pump light and a bias magnetic field, which are identical to pump light and a bias magnetic field incident on the first vapor cell 120, and the irradiation light may be incident on the second vapor cell 130.

The bias magnetic field may be a gradient magnetic field that causes a difference in a magnetic field applied to each of the vapor cells.

For example, an alkali metal may be a rubidium atom, which is one of alkali metals in Group 1 of the periodic table. The first alkali metal atom may be $^{85}$Rb with a mass number of $^{85}$ and the second alkali metal atom may be $^{87}$Rb with a mass number of $^{87}$. Furthermore, an extended operating frequency band of the atomic magnetometer according to an embodiment may not be limited to a specific frequency band, since the extended operating frequency band of the atomic magnetometer is determined by a gyromagnetic ratio and a bias magnetic field of $^{85}$Rb and $^{87}$Rb.

The atomic magnetometer according to an embodiment may minimize a decrease in magnetic sensitivity and may extend a measurement bandwidth by arranging a first vapor cell including all isotopes of one of alkali metals and a second vapor cell including one of the isotopes.

Furthermore, the atomic magnetometer according to an embodiment may effectively modify or extend the operating frequency of the atomic magnetometer by arranging the first vapor cell including all isotopes of one of alkali metals and the second vapor cell including one of the isotopes, thereby saving costs, energy, and space.

Figure 2:
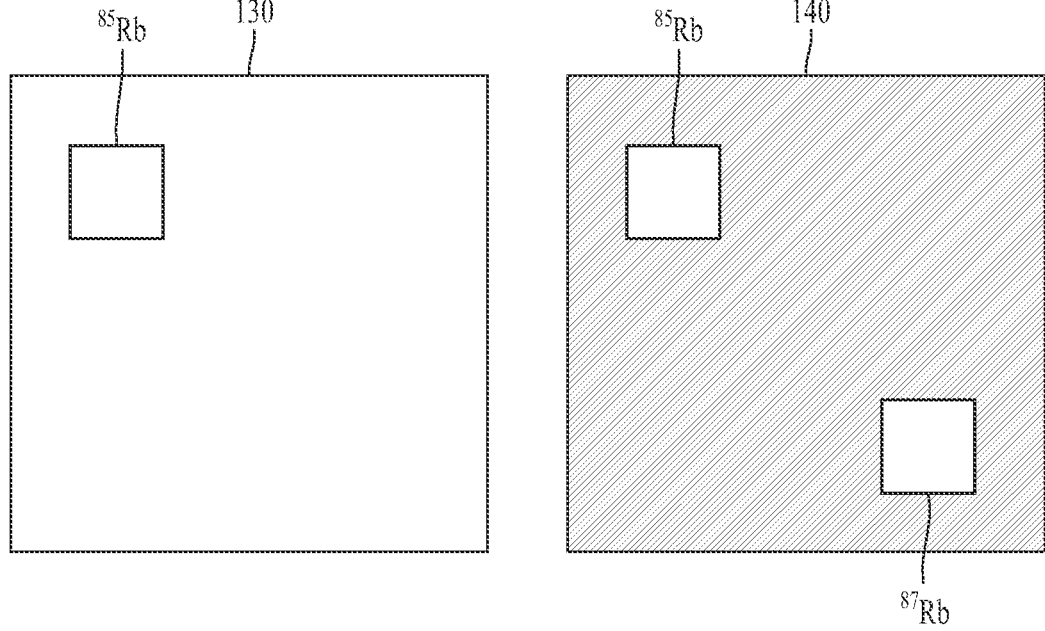
FIG. 2 is a diagram illustrating a first vapor cell and a second vapor cell included in an atomic magnetometer according to an embodiment.

FIG. 2 is a diagram illustrating a first vapor cell and a second vapor cell included in an atomic magnetometer according to an embodiment.

As illustrated in FIG. 2, the first vapor cell 120 may include both $^{85}$Rb and $^{87}$Rb, which are the isotopes of rubidium. The second vapor cell 130 may also include only the isotope $^{85}$Rb of rubidium, as illustrated in FIG. 2. According to an embodiment, the second vapor cell 130 may include only $^{87}$Rb.

Figure 3:
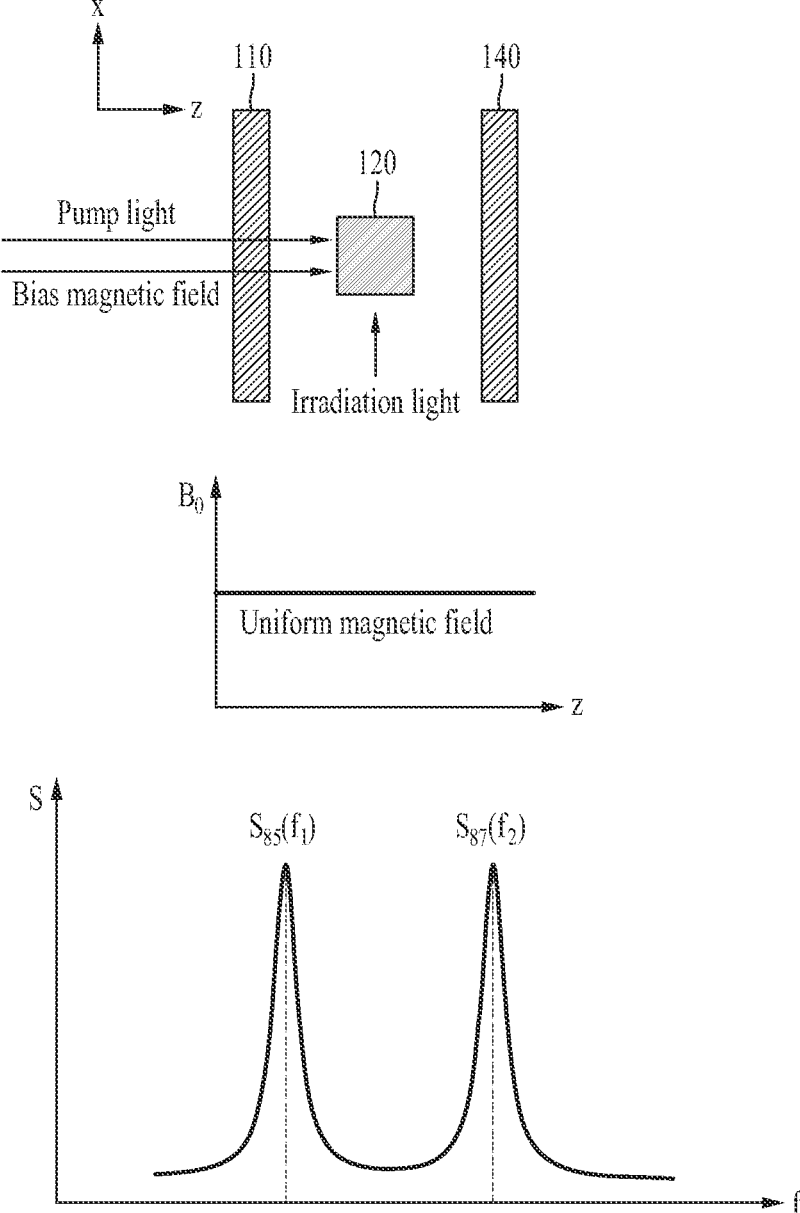
FIG. 3 is an example of an atomic magnetometer operating at a dual frequency, according to an embodiment.

FIG. 3 is an example of an atomic magnetometer operating at a dual frequency, according to an embodiment.

The gyromagnetic ratios of the isotopes $^{85}$Rb and $^{87}$Rb of rubidium are $\gamma\_85=4.66$ Hz/nT and $\gamma\_85=7.00$ Hz/nT, respectively. Accordingly, an atomic magnetometer having different operating frequencies under the same bias magnetic field may be configured.

The atomic magnetometer having different operating frequencies under the same bias magnetic field may be configured with a structure in which the vapor cell 120 is disposed between the coils 110 and 140, as illustrated in FIG. 3. The vapor cell 120 may receive pump light and a bias magnetic field transmitted from the coil 110 and irradiation light incident from a direction perpendicular to the positions of the coils 110 and 140. Furthermore, the vapor cell 120 may include both a first alkali metal atom ($^{85}$Rb) and a second alkali metal atom ($^{87}$Rb), which are the isotopes of one of alkali metals. In other words, the vapor cell 120 may be configured with the same structure as the first vapor cell 120 of FIG. 1.

The pump light may be tuned to function as first pump light acting on $^{85}$Rb and second pump light acting on $^{87}$Rb. Furthermore, the wavelength of the pump light may simultaneously act on the $F_g=3 \rightarrow F_e=2,3$ transition of the first alkali metal atom and the $F_g=2 \rightarrow F_e=1,2$ transition of the second alkali metal atom.

The irradiation light may be tuned such that irradiation light, which is red-detuned based on the F=1→F'=1 transition of the second alkali metal atom, corresponds to irradiation light, which is blue-detuned based on the F=2→F'=3 transition of the first alkali metal atom.

The pump light and the irradiation light may not share the same ground level at energy levels of the first alkali metal atom and the second alkali metal atom.

In addition, when the bias magnetic field is 4.3 microteslas (μT), the operating frequencies of the atomic magnetometer may be 20.07 kilohertz (kHz) and 30.10 kHz, respectively.

FIG. 4 is an example of tuning pump light and irradiation light of an atomic magnetometer according to an embodiment.

A signal of FIG. 4 is a saturated absorption spectroscopy signal and may represent the precise value of an atomic transition frequency between the ground state and optically excited state of an atom. The pump light illustrated in FIG. 4 is not precisely tuned to the atomic transition line of the atom and may function as first pump light acting on $^{85}$Rb and second pump light acting on $^{87}$Rb. However, since there is a linewidth on the frequency axis, the pump light illustrated in FIG. 4 may appear as if the pump light is tuned to the position of the first pump light of $^{85}$Rb and the position of the second pump light of $^{87}$Rb.

Figure 5:
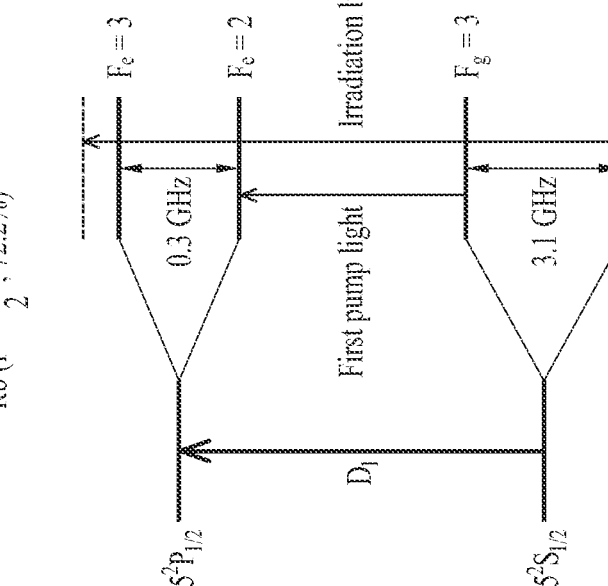
FIG. 5 is an example of an energy transition of pump light and irradiation light of an atomic magnetometer according to an embodiment.

FIG. 5 is an example of an energy transition of pump light and irradiation light of an atomic magnetometer according to an embodiment.

Isotopes of all alkali metals may have a non-zero nuclear spin and the nuclear spins of $^{85}$Rb and $^{87}$Rb may be 5/2 and 3/2, respectively. The total angular momentum and nuclear spin of an electron are strongly coupled to each other through hyperfine interaction. Therefore, as illustrated in FIG. 5, $^{85}$Rb and $^{87}$Rb may have different energy levels and the gyromagnetic ratio ($\gamma$) of an atom may be expressed by Equation 1, considering a nuclear spin.

$$\gamma \approx \pm 2\pi \times (2.8\,\text{MHz/G})/(2I+1) \qquad \text{[Equation 1]}$$

Here, the gyromagnetic ratios of $^{85}$Rb and $^{87}$Rb may be γ_85=4.66 Hz/nT and γ_85=7.00 Hz/nT, respectively. Therefore, a vapor cell including both $^{85}$Rb and $^{87}$Rb may have two different operating frequencies in the same operating environment and the ratio between these two frequencies may be determined by the ratio between their gyromagnetic ratios (approximately 1.5 times).

Furthermore, the wavelength of the tuned pump light, as shown in FIG. 4, may align with the center of Di line of an alkali metal atom and tuning the wavelength of a single pump light source may enable the pump light to simultaneously act on the $F_g=3 \rightarrow F_e=2,3$ transition of a first alkali metal atom and the $F_g=2 \rightarrow F_e=1,2$ transition of a second alkali metal atom.

Furthermore, the wavelength of irradiation light may be tuned to deviate a few nanometers (nm) from the Di line of the alkali metal atom such that the absorption of the irradiation light is minimized. For example, an irradiation light source, which is red-detuned based on the F=1→F'=1 transition of the second alkali metal atom, may correspond to an irradiation light source, which is blue-detuned based on the F=2→F'=3 transition of the first alkali metal atom. Therefore, using a single irradiation light source, the density variation of rubidium atoms in the ground states of the first and second alkali metal atoms may be simultaneously observed. Moreover, it is necessary that pump light and irradiation light do not share the same ground level at the energy levels of the first and second alkali metal atoms such that the irradiation light does not influence atom spins aligned by the pump light.

Figure 6:
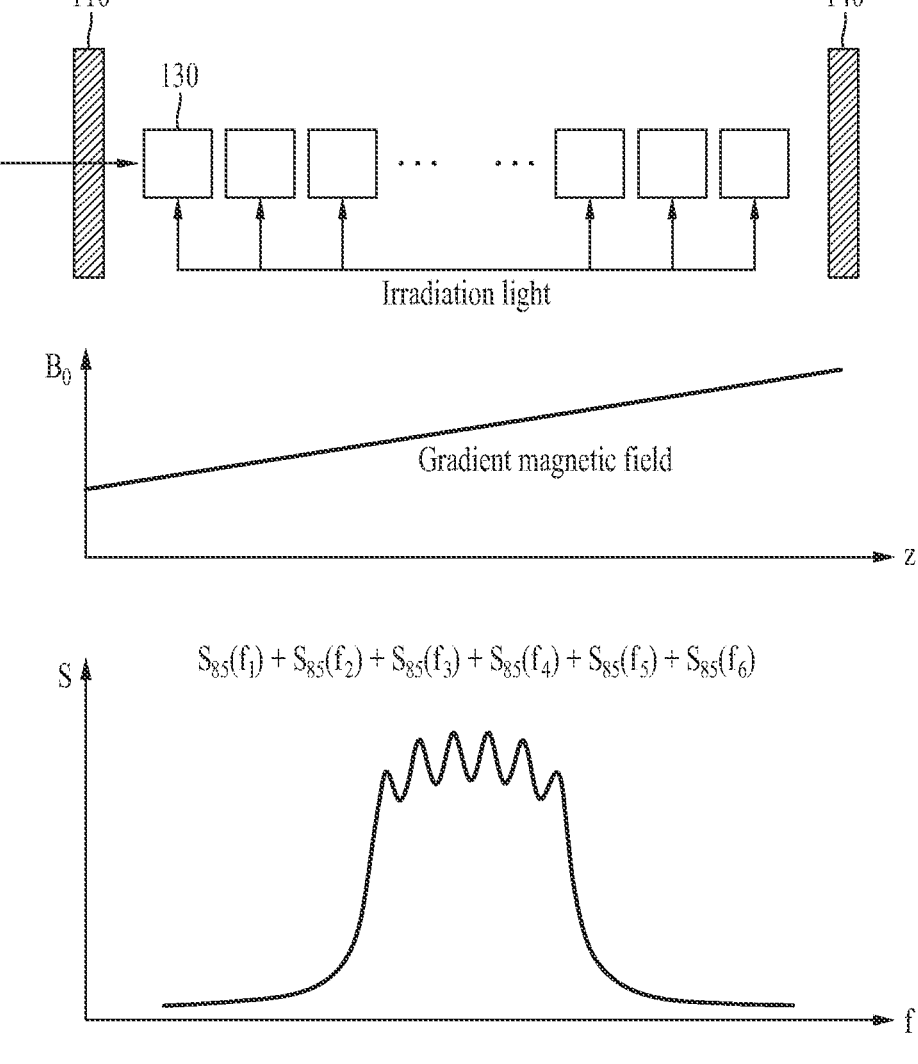
FIG. 6 is an example of an atomic magnetometer having a single operating frequency in an embodiment.

FIG. 6 is an example of an atomic magnetometer having a single operating frequency in an embodiment.

As illustrated in FIG. 6, the atomic magnetometer having a single operating frequency may be configured with a structure in which a plurality of vapor cells 130 is disposed between the coils 110 and 140. The vapor cells 130 may receive pump light and a bias magnetic field transmitted from the coil 110 and irradiation light incident from a direction perpendicular to the position of the coil 110. The wavelength of the pump light may simultaneously act on the $F_g=3 \rightarrow F_e=2,3$ transition of a first alkali metal atom and the $F_g=2 \rightarrow F_e=1,2$ transition of a second alkali metal atom. Furthermore, the irradiation light may be tuned such that irradiation light, which is red-detuned based on the F=1→F'=1 transition of the second alkali metal atom, corresponds to irradiation light, which is blue-detuned based on the F=2→F'=3 transition of the first alkali metal atom.

The vapor cells 130 may include one of the first alkali metal atom and the second alkali metal atom, which are the isotopes of one of alkali metals.

Since the vapor cells 130 include only one isotope, each of the vapor cells 130 may operate at a single frequency. In the arrangement of the vapor cells 130, each of the vapor cells 130 is required to operate at an adjacent and different operating frequency, and thus, bias magnetic fields applied to the vapor cells may need to have predetermined differences. Therefore, the bias magnetic fields may be gradient magnetic fields that cause a difference in a magnetic field applied to each of the vapor cells 130.

For example, a bias magnetic field may be applied to each of the vapor cells 130 such that the resonance frequency of an alkali metal atom has a difference ranging from several hundred Hertz to several kHz. In this example, the atomic magnetometer may have a relatively broad measurement frequency bandwidth.

Figure 7:
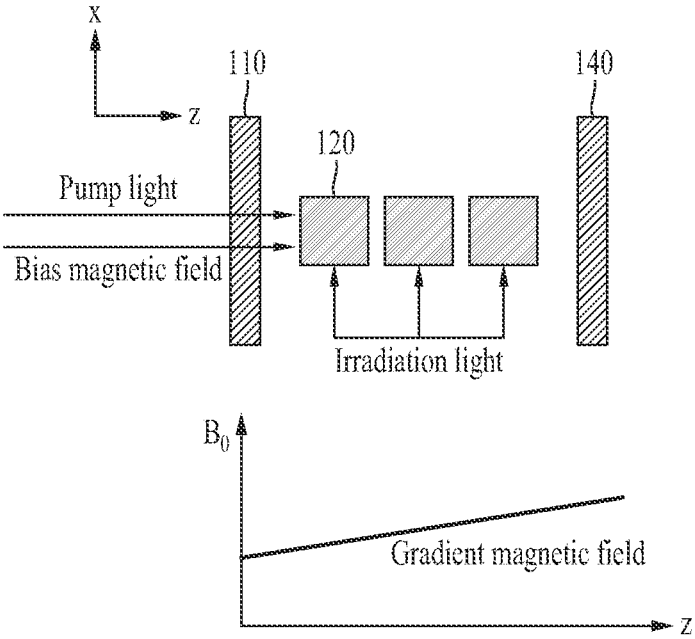
FIG. 7 is an example of an atomic magnetometer having a dual operating frequency in an embodiment.
Figure 7:
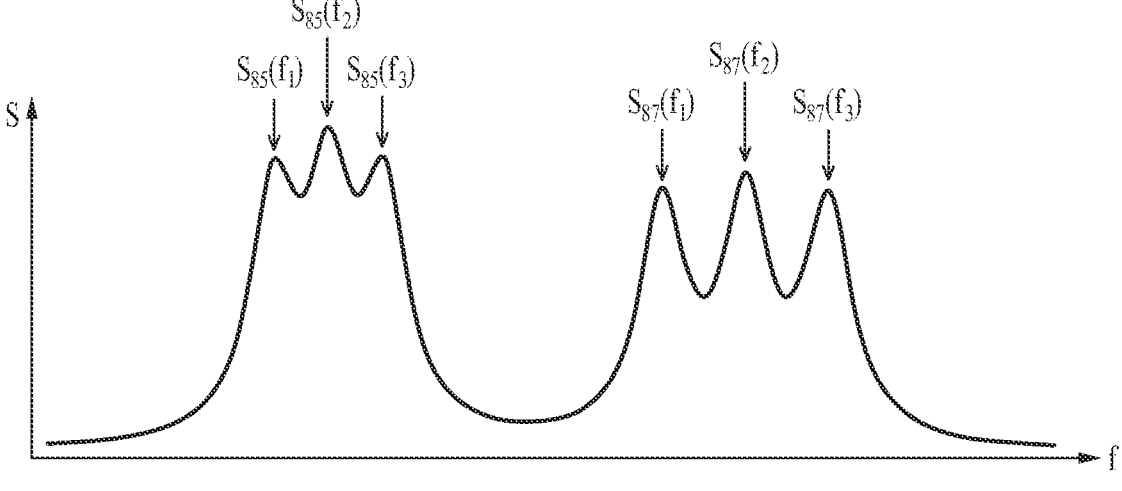

FIG. 7 is an example of an atomic magnetometer having a dual operating frequency in an embodiment.

As illustrated in FIG. 7, the atomic magnetometer having a dual operating frequency may be configured with a structure in which a plurality of vapor cells 120 is disposed between the coils 110 and 140. The vapor cells 120 may receive pump light and a bias magnetic field transmitted from the coil 110 and irradiation light incident from a direction perpendicular to the position of the coil 110. In addition, the vapor cells 120 may include both a first alkali metal atom ($^{85}$Rb) and a second alkali metal atom ($^{87}$Rb), which are the isotopes of one of alkali metals.

In FIGS. 7, $S_{85}$ and $S_{87}$ may be signals respectively corresponding to $^{85}$Rb and $^{87}$Rb. Since the vapor cells 120 include both the first alkali metal atom ($^{85}$Rb) and the second alkali metal atom ($^{87}$Rb), the vapor cells 120 may operate in a dual operating frequency group. In this case, a response signal may not be observed in a predetermined frequency band.

Figure 8:
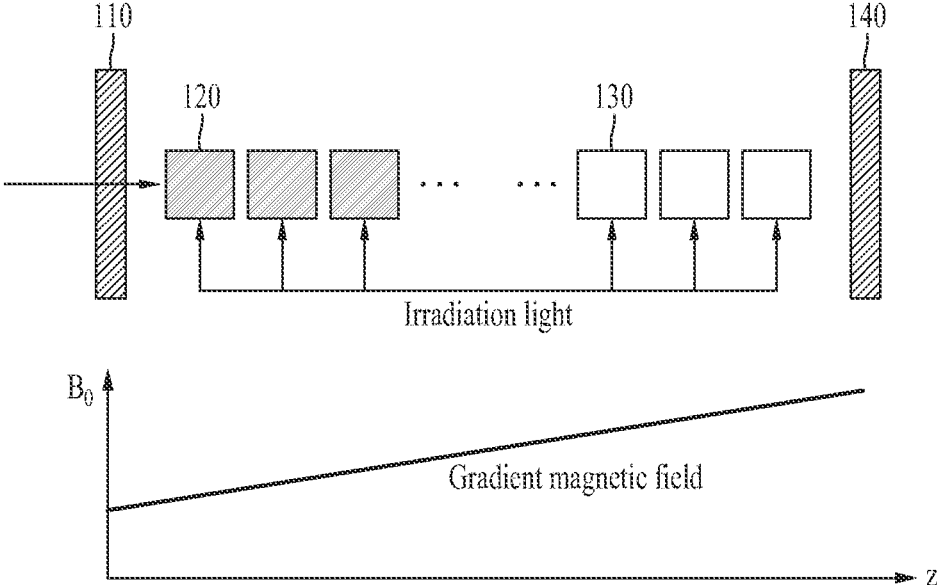
FIG. 8 is an example of an atomic magnetometer including a first vapor cell and a second vapor cell in an embodiment.
Figure 8:
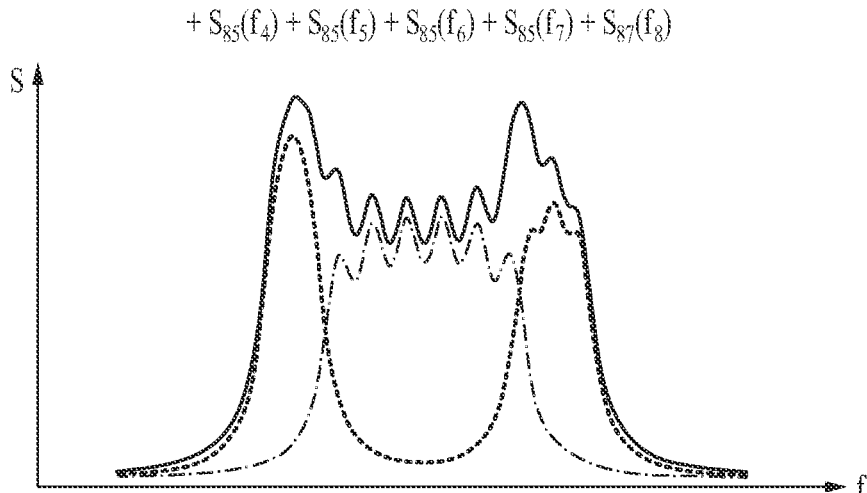

FIG. 8 is an example of an atomic magnetometer including a first vapor cell and a second vapor cell in an embodiment.

The atomic magnetometer including the first vapor cell and the second vapor cell illustrated in FIG. 1 may have an extended frequency as illustrated in FIG. 8.

The response frequencies of $S_{85}$ and $S_{87}$ are roughly 1.5 times each other (the ratio between $\gamma\_85$ and $\gamma\_87$) and a response frequency is proportional to a bias magnetic field. Therefore, the atomic magnetometer including the first vapor cell and the second vapor cell may obtain a signal even in a non-responsive region in FIG. 8, using a serial group arrangement of the first vapor cell 120 and the second vapor cell 130. Furthermore, considering a gyromagnetic ratio and the amplitude of a bias magnetic field, an atomic magnetometer operating in various regions may be configured.

The present disclosure may minimize a decrease in magnetic sensitivity and may extend a measurement bandwidth by arranging a first vapor cell including all isotopes of one alkali metal and a second vapor cell including one of the isotopes.

In addition, the present disclosure may effectively modify or extend the operating frequency of an atomic magnetometer by arranging a first vapor cell including all isotopes of one alkali metal and a second vapor cell including one of the isotopes, thereby saving costs, energy, and space.

Although the present specification includes details of a plurality of specific embodiments, the details should not be construed as limiting any invention or a scope that may be claimed, but rather should be construed as being descriptions of features that may be peculiar to specific embodiments of specific inventions. Specific features described in the present specification in the context of individual embodiments may be combined and implemented in a single embodiment. On the contrary, various features described in the context of a single embodiment may be implemented in a plurality of embodiments individually or in any appropriate sub-combination. Furthermore, although features may operate in a specific combination and may be initially depicted as being claimed, one or more features of a claimed combination may be excluded from the combination in some cases and the claimed combination may be changed into a sub-combination or a modification of the sub-combination.

Likewise, although operations are depicted in a specific order in the drawings, it should not be understood that the operations must be performed in the depicted specific order or sequential order or all the shown operations must be performed in order to obtain a preferred result. In specific cases, multitasking and parallel processing may be advantageous. In a specific case, multitasking and parallel processing may be advantageous. In addition, it should not be understood that the separation of various device components of the aforementioned embodiments is required for all the embodiments and it should be understood that the aforementioned program components and apparatuses may be integrated into a single software product or packaged into multiple software products.

The embodiments disclosed in the present specification and the drawings are intended merely to present specific examples in order to aid in understanding of the disclosure, but are not intended to limit the scope of the disclosure. It will be apparent to those skilled in the art that various modifications based on the technical spirit of the disclosure, as well as the disclosed embodiments, may be made.

What is claimed is:

1. An atomic magnetometer comprising:
coils configured to transmit incident pump light and a bias magnetic field; and
a vapor cell positioned between the coils and receiving the pump light and the bias magnetic field transmitted from the coils and irradiation light incident from a direction perpendicular to positions of the coils,
wherein the vapor cell comprises both a first alkali metal atom and a second alkali metal atom, which are isotopes of one of alkali metals,
wherein the pump light and the irradiation light do not share a same ground level at energy levels of the first alkali metal atom and the second alkali metal atom.

2. The atomic magnetometer of claim 1, wherein a wavelength of the pump light simultaneously acts on an $F_g=3 \rightarrow F_e=2,3$ transition of the first alkali metal atom and an $F_g=2 \rightarrow F_e=1,2$ transition of the second alkali metal atom.

3. The atomic magnetometer of claim 1, wherein the irradiation light is tuned such that irradiation light, which is red-detuned based on an $F=1 \rightarrow F'=1$ transition of the second alkali metal atom, corresponds to radiation light, which is blue-detuned based on an $F=2 \rightarrow F'=3$ transition of the first alkali metal atom.

4. The atomic magnetometer of claim 1, wherein the vapor cell comprises both $^{85}$Rb and $^{87}$Rb, which are isotopes of rubidium.

5. The atomic magnetometer of claim 4, wherein the pump light is tuned to function as first pump light acting on $^{85}$Rb and second pump light acting on $^{87}$Rb.

6. An atomic magnetometer comprising:
coils configured to transmit incident pump light and a bias magnetic field; and
vapor cells positioned between the coils and receiving the pump light and the bias magnetic field transmitted from the coils and irradiation light incident from a direction perpendicular to positions of the coils,
wherein the vapor cells comprise one of a first alkali metal atom and a second alkali metal atom, which are isotopes of one of alkali metals, and
wherein the bias magnetic field is a gradient magnetic field configured to cause a difference in a magnetic field applied to each of the vapor cells,
wherein the pump light and the irradiation light do not share a same ground level at energy levels of the first alkali metal atom and the second alkali metal atom.

7. The atomic magnetometer of claim 6, wherein a wavelength of the pump light simultaneously acts on an $F_g=3 \rightarrow F_e=2,3$ transition of the first alkali metal atom and an $F_g=2 \rightarrow F_e=1,2$ transition of the second alkali metal atom.

8. The atomic magnetometer of claim 6, wherein the irradiation light is tuned such that irradiation light, which is red-detuned based on an $F=1 \rightarrow F'=1$ transition of the second alkali metal atom, corresponds to radiation light, which is blue-detuned based on an $F=2 \rightarrow F'=3$ transition of the first alkali metal atom.

9. An atomic magnetometer comprising:
coils configured to transmit incident pump light and a bias magnetic field;
a first vapor cell comprising both a first alkali metal atom and a second alkali metal atom, which are isotopes of one of alkali metals and receiving the pump light and the bias magnetic field transmitted from the coils and irradiation light incident from a direction perpendicular to positions of the coils; and a second vapor cell comprising one of the first alkali metal atom or the second alkali metal atom, wherein the irradiation light, the pump light, and the bias magnetic field are incident on the second vapor cell, wherein the pump light and the irradiation light do not share a same ground level at energy levels of the first alkali metal atom and the second alkali metal atom.

10. The atomic magnetometer of claim 9, wherein the second vapor cell is disposed in series with the first vapor cell, wherein the irradiation light, pump light passing through the first vapor cell, and a bias magnetic field are incident on the second vapor cell.

11. The atomic magnetometer of claim 9, wherein the second vapor cell is disposed in parallel with the first vapor cell, wherein pump light and a bias magnetic field, which are identical to pump light and a bias magnetic field incident on the first vapor cell, and the irradiation light are incident on the second vapor cell.

12. The atomic magnetometer of claim 9, wherein the bias magnetic field is a gradient magnetic field configured to cause a difference in a magnetic field applied to each of the first vapor cell and the second vapor cell.

* * * * *